(12) United States Patent
Matsuura

(10) Patent No.: US 11,688,585 B2
(45) Date of Patent: Jun. 27, 2023

(54) PLASMA PROCESSING APPARATUS AND PLASMA PROCESSING METHOD

(71) Applicant: Tokyo Electron Limited, Tokyo (JP)

(72) Inventor: Hiroyuki Matsuura, Iwate (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 262 days.

(21) Appl. No.: 17/084,912

(22) Filed: Oct. 30, 2020

(65) Prior Publication Data

US 2021/0142988 A1 May 13, 2021

(30) Foreign Application Priority Data

Nov. 7, 2019 (JP) .............................. JP2019-202610

(51) Int. Cl.
*H01J 37/32* (2006.01)
*C23C 16/34* (2006.01)
*C23C 16/455* (2006.01)
*H01L 21/02* (2006.01)

(52) U.S. Cl.
CPC ...... *H01J 37/32458* (2013.01); *C23C 16/345* (2013.01); *C23C 16/45536* (2013.01); *C23C 16/45544* (2013.01); *H01J 37/3244* (2013.01); *H01L 21/0217* (2013.01); *H01L 21/0228* (2013.01); *H01L 21/02274* (2013.01); *H01J 2237/332* (2013.01)

(58) Field of Classification Search
CPC ........ C23C 16/45544; C23C 16/45536; H01L 21/02274; H01J 37/32458; H01J 37/3244; H01J 37/32
See application file for complete search history.

(56) References Cited

U.S. PATENT DOCUMENTS

| 2002/0005171 A1* | 1/2002 | Hori | C23C 16/545 |
| | | | 118/724 |
| 2005/0051517 A1* | 3/2005 | Oehrlein | H01J 37/32623 |
| | | | 156/345.43 |
| 2007/0234961 A1* | 10/2007 | Takahashi | C23C 16/345 |
| | | | 118/725 |

FOREIGN PATENT DOCUMENTS

| JP | 2008-300688 A | 12/2008 |
| WO | 2010/050363 A1 | 5/2010 |

* cited by examiner

*Primary Examiner* — Joseph A Miller, Jr.
(74) *Attorney, Agent, or Firm* — Venjuris, P.C.

(57) ABSTRACT

A plasma processing apparatus includes: a processing container extended in a longitudinal direction; a raw material gas supply configured to supply a raw material gas into the processing container; a plasma partition wall provided along the longitudinal direction of the processing container, defining a plasma generation space therein, and having an opening through which the plasma generation space and an inside of the processing container communicate with each other; a reaction gas supply configured to supply a reaction gas that reacts with the raw material gas, into the plasma generation space; and an opening/closing unit configured to open/close the opening.

19 Claims, 9 Drawing Sheets

FIG. 5

| | CLOSING POSITION | CLOSING POSITION → OPENING POSITION | OPENING POSITION |
|---|---|---|---|
| DRIVING UNIT | 62a, 62b, 62c (62) | 62a, 62b, 62c (62) | 62a, 62b, 62c (62) |
| OPENING/ CLOSING PLATE | 61a, 61, 37a, 22a, 36a, 22 | 61a, 61, 37a, 22a, 36a, 22 | 61a, 61, 37a, 22a, 36a, 22 |

PLASMA PROCESSING APPARATUS AND PLASMA PROCESSING METHOD

CROSS-REFERENCE TO RELATED APPLICATIONS

This application is based on and claims priority from Japanese Patent Application No. 2019-202610 filed on Nov. 7, 2019 with the Japan Patent Office, the disclosure of which is incorporated herein in its entirety by reference.

TECHNICAL FIELD

The present disclosure relates to a plasma processing apparatus and a plasma processing method.

BACKGROUND

In a film forming apparatus for forming a predetermined thin film, a technique is known which activates a processing gas by plasma in a plasma generation space formed by a plasma partition wall provided close to one side of a processing container, and supplies the activated processing gas into the processing container (see, e.g., Japanese Patent Laid-Open Publication No. 2008-300688).

SUMMARY

According to an aspect of the present disclosure, a plasma processing apparatus includes: a processing container extended in a longitudinal direction; a raw material gas supply configured to supply a raw material gas into the processing container; a plasma partition wall provided along the longitudinal direction of the processing container, defining a plasma generation space therein, and having an opening through which the plasma generation space and an inside of the processing container communicate with each other; a reaction gas supply configured to supply a reaction gas that reacts with the raw material gas, into the plasma generation space; and an opening/closing unit configured to open/close the opening.

The foregoing summary is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE DRAWINGS

FIG. 5 is a view illustrating an operation of the opening/closing unit.

DETAILED DESCRIPTION

Figure 1:
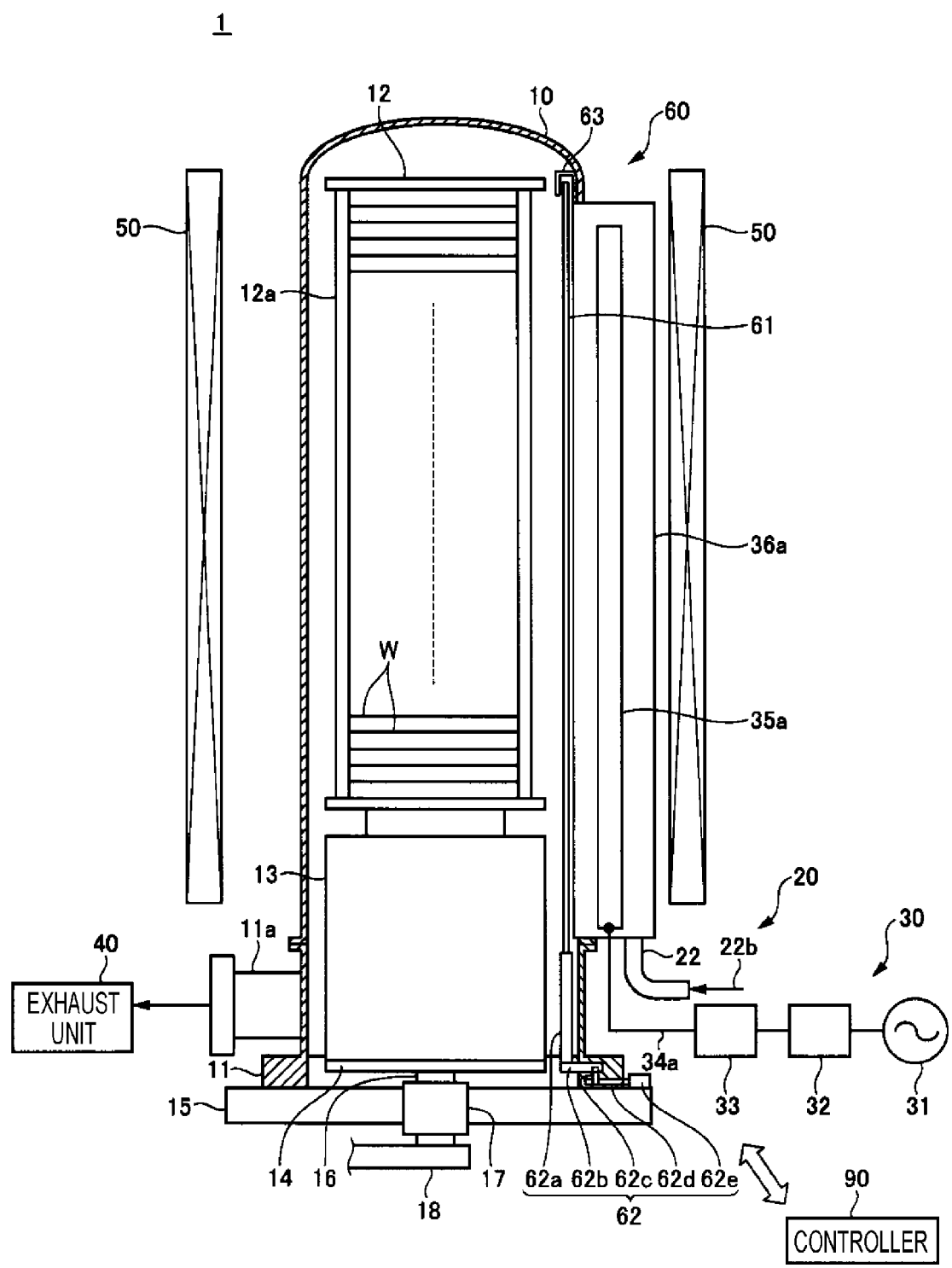
FIG. 1 is a schematic view (1) illustrating an example of a plasma processing apparatus according to a first embodiment.

In the following detailed description, reference is made to the accompanying drawings which form a part hereof. The illustrative embodiments described in the detailed description, drawing, and claims are not meant to be limiting. Other embodiments may be utilized, and other changes may be made without departing from the spirit or scope of the subject matter presented here.

Hereinafter, non-limiting embodiments of the present disclosure will be described with reference to the accompanying drawings. In all of the accompanying drawings, similar or corresponding members or components will be denoted by the same or corresponding reference numerals, and overlapping descriptions thereof will be omitted.

[Particles]

In a plasma processing apparatus, a process is repeatedly performed which carries a silicon substrate into a processing container and forms a silicon nitride film on the substrate by an atomic layer deposition (ALD). In this plasma processing apparatus, when a certain cumulative film thickness exceeds a threshold value, the amount of particles generated on the substrate increases in proportion to the cumulative film thickness.

Accordingly, in order to prevent the amount of particles from exceeding a controlled value, the silicon nitride film formed on the inner wall of the processing container is removed by a dry cleaning at the time when the silicon nitride film reaches a predetermined cumulative film thickness. The process of forming the silicon nitride film by the ALD is repeated again until the silicon nitride film reaches the predetermined cumulative film thickness, and the dry cleaning is performed. The time period from a dry cleaning to the next dry cleaning will be referred to as a "dry cleaning cycle," and the length of the time period is expressed by the cumulative film thickness ($\mu$m). From the viewpoint of improving the operation rate of the plasma processing apparatus, it is preferable that the dry cleaning cycle is long.

In many cases, the particles are generated on the substrate mainly from a plasma generator near the substrate. It is understood that a portion of the silicon nitride film deposited on the plasma generator is peeled off by the action of plasma, and adheres as minute particles to the surface of the substrate. Thus, in order to reduce the particles, it is important to suppress the deposition of a film on the plasma generator.

Hereinafter, descriptions will be made on a plasma processing apparatus and a plasma processing method which are capable of suppressing the deposition of a film on the plasma generator so as to extend the dry cleaning cycle.

First Embodiment

Figure 2:
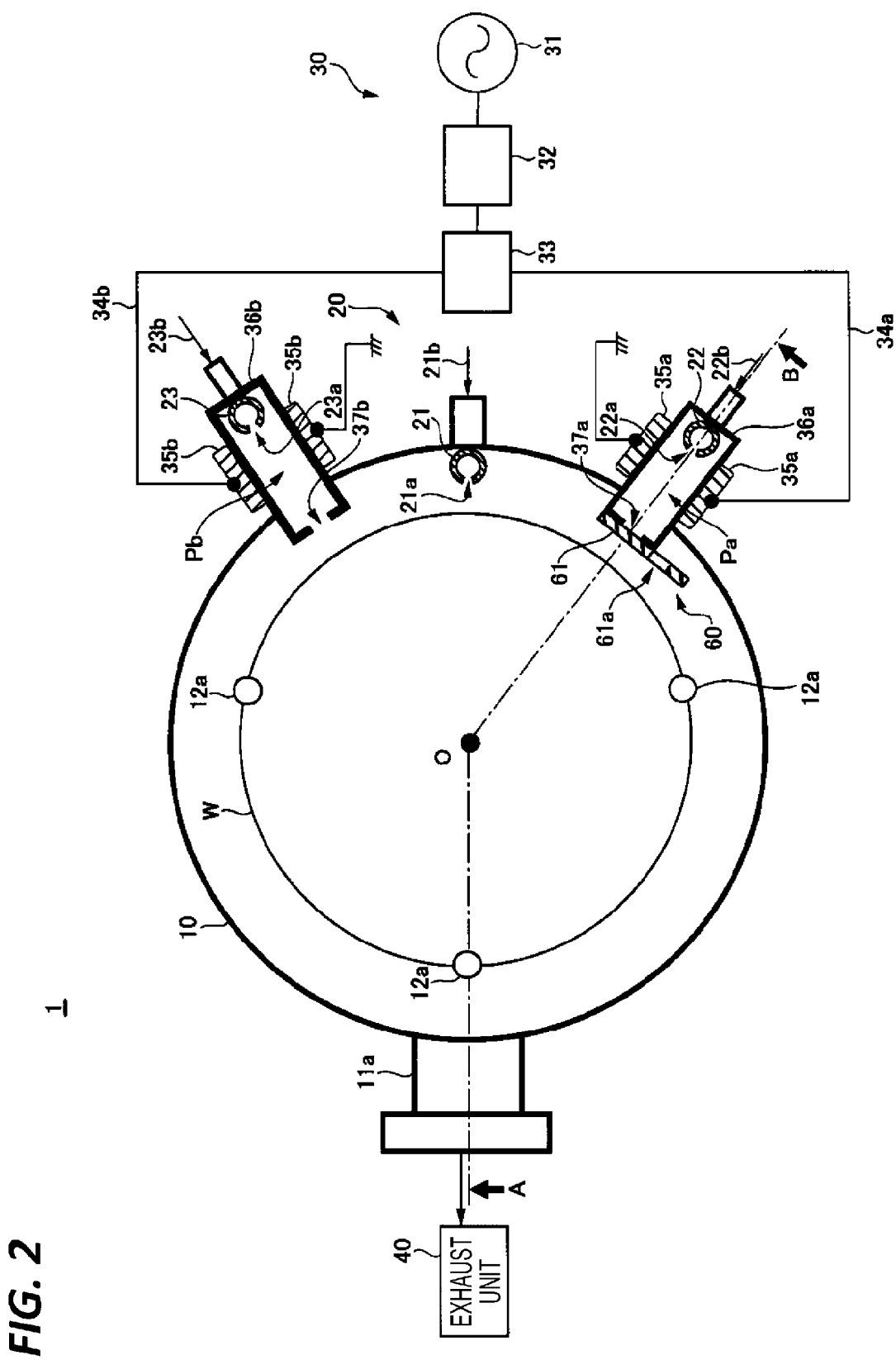
FIG. 2 is a schematic view (2) illustrating the example of the plasma processing apparatus according to the first embodiment.

A plasma processing apparatus according to a first embodiment will be described. FIGS. 1 and 2 are schematic views illustrating an example of the plasma processing apparatus of the first embodiment. FIG. 1 is a partial cross-sectional view taken along the line A-O-B in FIG. 2. FIG. 2 omits the illustration of a heater 50 and a controller 90.

The plasma processing apparatus 1 includes a processing container 10, a gas supply 20, a plasma generator 30, an exhaust unit 40, a heater 50, an opening/closing unit 60, and a controller 90.

The processing container 10 has a cylindrical shape opened at the lower end thereof and having a ceiling. The entire processing container 10 is formed of, for example, quartz. A manifold 11 is connected to the opening of the lower end of the processing container 10 via a sealing member (not illustrated) such as an O-ring. The manifold 11 is formed of a metal and has a cylindrical shape.

The manifold 11 supports the lower end of the processing container 1. The manifold 11 is formed of a metal (e.g., stainless steel).

A substrate holder 12 is formed of, for example, quartz. The substrate holder 12 has a plurality of rods 12a, and a plurality of substrates W is supported in multiple stages by grooves (not illustrated) formed in the rods 12a. In other words, the substrate holder 12 holds the plurality of substrates W substantially horizontally at intervals along the vertical direction. Each substrate W may be, for example, a semiconductor wafer. The substrate holder 12 is inserted into the processing container 10 from a portion below the manifold 11. The substrate holder 12 is placed on a table 14 via a heat reserving cylinder 13.

The heat reserving cylinder 13 prevents the substrate holder 12 from being cooled by a heat transfer with the side of a lid 15, and keeps the substrate holder 12 warm. The heat reserving cylinder 13 is formed of, for example, quartz.

The table 14 is supported on a rotary shaft 16 that penetrates the lid 15 formed of a metal (e.g., stainless steel) and configured to open/close the opening of the lower end of the manifold 11. A magnetic fluid seal 17 is provided at the portion of the lid 15 that the rotary shaft 16 penetrates, and airtightly seals and rotatably supports the rotary shaft 16. A seal member (not illustrated) such as an O-ring is provided between the peripheral portion of the lid 15 and the lower end of the manifold 11 to maintain the airtightness of the processing container 10.

The rotary shaft 16 is attached to the tip of an arm 18 supported by a lifting mechanism (not illustrated) such as a boat elevator, and the substrate holder 12 and the lid 15 are moved up and down in an integrated form to be inserted/ removed into/from the processing container 10. The table 14 may be provided to be fixed to the lid 15, such that the substrates W are processed without rotating the substrate holder 12.

The gas supply 20 is configured to supply a gas into the processing container 10. In the present embodiment, the gas supply 20 includes gas supply pipes 21, 22, and 23. The gas supply pipes 21, 22, and 23 are formed of, for example, quartz.

The gas supply pipe 21 penetrates the side wall of the manifold 11 inward, is bent upward, and extends vertically. The vertical portion of the gas supply pipe 21 is provided inside the processing container 10. A plurality of gas holes 21a is formed in the vertical portion of the gas supply pipe 21 at predetermined intervals over the vertical length of the gas supply pipe 21 that corresponds to the substrate supporting range of the substrate holder 12. The gas holes 21a discharge a gas horizontally. The gas supply pipe 21 supplies a raw material gas into the processing container 10 from the gas holes 21a. A gas pipe 21b is connected to the gas supply pipe 21, and a flow rate controller and a valve (both not illustrated) are provided in the gas pipe 21b. As a result, the raw material gas is supplied into the processing container 10 at a controlled flow rate. As the raw material gas, silicon raw material gas such as dichlorosilane (DCS: $SiH_2Cl_2$) gas may be used. The gas supply pipe 21 may be configured to supply a purge gas such as nitrogen ($N_2$) gas or argon (Ar) gas, in addition to the raw material gas.

The gas supply pipe 22 penetrates the bottom of a plasma partition wall 36a (to be described) later inward, and extends vertically. The vertical portion of the gas supply pipe 22 is provided in a plasma generation space Pa (to be described later). A plurality of gas holes 22a is formed in the vertical portion of the gas supply pipe 22 at predetermined intervals over the vertical length of the gas supply pipe 22 that corresponds to the substrate supporting range of the substrate holder 12. The gas holes 22a discharge a gas horizontally. The gas supply pipe 22 supplies a reaction gas into the plasma generation space Pa from the gas holes 22a. A flow rate controller and a valve (both not illustrated) are provided in a gas pipe 22b. As a result, the reaction gas is supplied into the processing container 10 at a controlled flow rate in a state of being activated by plasma in the plasma generation space Pa. As the reaction gas, nitride gas such as ammonia ($NH_3$) gas may be used. The gas supply pipe 22 may be configured to supply a purge gas such as $N_2$ gas or Ar gas, in addition to the reaction gas.

The gas supply pipe 23 penetrates the bottom of a plasma partition wall 36b (to be described later) inward, and extends vertically. The vertical portion of the gas supply pipe 23 is provided in a plasma generation space Pb (to be described later). A plurality of gas holes 23a is formed in the vertical portion of the gas supply pipe 23 at predetermined intervals over the vertical length of the gas supply pipe 23 that corresponds to the substrate supporting range of the substrate holder 12. The gas holes 23a discharge a gas horizontally. The gas supply pipe 23 supplies a reaction gas into the plasma generation space Pb from the gas holes 23a. A flow rate controller and a valve (both not illustrated) are provided in a gas pipe 23b. As a result, the reaction gas is supplied into the processing container 10 at a controlled flow rate in a state of being activated by plasma in the plasma generation space Pb. As the reaction gas, nitride gas such as $NH_3$ gas may be used. The gas supply pipe 23 may be configured to supply a purge gas such as $N_2$ gas or Ar gas, in addition to the reaction gas.

The gas supply 20 may further include a gas supply pipe (not illustrated) that supplies an inert gas such as $N_2$ gas or Ar gas into the processing container 10.

The plasma generator 30 activates the reaction gas by plasma. In the present embodiment, the plasma generator 30 includes a radio-frequency power supply 31, a matching circuit 32, a switching unit 33, power feeding lines 34a and 34b, plasma electrodes 35a and 35b, and plasma partition walls 36a and 36b.

The radio-frequency power supply 31 is configured to supply a radio-frequency power of a predetermined frequency, for example, 13.56 MHz to the plasma electrodes 35a and 35b via the matching circuit 32. In the present embodiment, the radio-frequency power supply 31 is connected to the lower ends of the plasma electrodes 35a and 35b via the switching unit 33, and supplies the radio-frequency power to either one of the plasma electrodes 35a and 35b. As a result, the reaction gas discharged from the gas holes 22a and 23a of the gas supply pipes 22 and 23 is activated by plasma in the plasma generation spaces Pa and Pb defined by the plasma partition walls 36a and 36b. The activated reaction gas is supplied into the processing container 10 through openings 37a and 37b formed in the plasma partition walls 36a and 36b.

The switching unit 33 is configured to switch the connection state between the radio-frequency power supply 31 and the plasma electrodes 35a and 35b. The switching unit 33 may be, for example, a vacuum relay unit.

The power feeding lines 34a and 34b are configured to supply the radio-frequency power from the radio-frequency power supply 31 to the plasma electrodes 35a and 35b. In the present embodiment, the power feeding line 34a electrically connects the switching unit 33 and the plasma electrode 35a to each other, and the power feeding line 34b electrically connects the switching unit 33 and the plasma electrode 35b to each other.

The pair of plasma electrodes 35a each have a long slender shape, and are disposed to face each other along the vertical direction on the outer surfaces of both side walls of the plasma partition wall 36a. One of the plasma electrodes 35a is connected to the radio-frequency power supply 31 via the power feeding line 34a, and the other is grounded.

The pair of plasma electrodes 35b each have a long slender shape, and are disposed to face each other along the vertical direction on the outer surfaces of both side walls of the plasma partition wall 36b. One of the plasma electrodes 35b is connected to the radio-frequency power supply 31 via the power feeding line 34b, and the other is grounded.

The plasma partition walls 36a and 36b are formed on a portion of the side wall of the processing container 10. In the present embodiment, the plasma partition walls 36a and 36b are airtightly welded to the side wall of the processing container 10. The plasma partition walls 36a and 36b are formed of, for example, quartz. Each of the plasma partition walls 36a and 36b has a concave cross section, and covers the opening formed in the side wall of the processing container 10. The opening is formed slender and elongated vertically, so as to cover all of the substrates W supported by the substrate holder 12 in the vertical direction. The plasma partition walls 36a and 36b form the plasma generation spaces Pa and Pb that communicate with the inside of the processing container 10. The gas supply pipes 22 and 23 are disposed in the plasma generation spaces Pa and Pb to discharge the reaction gas. The plasma partition walls 36a and 36b have openings 37a and 37b through which the plasma generation spaces Pa and Pb communicate with the inside of the processing container 10, and the reaction gas activated by plasma in the plasma generation spaces Pa and Pb is supplied into the processing container 10 through the openings 37a and 37b.

The exhaust unit 40 is connected to an exhaust port 11a formed in the manifold 11, and exhausts the inside of the processing container 10 through the exhaust port 11a. In the present embodiment, the exhaust unit 40 includes a pressure adjusting valve and a vacuum pump, and evacuates the atmosphere inside the processing container 10 while controlling the pressure in the processing container 10.

The heater 50 is provided to surround the outer periphery of the processing container 10, and heats the substrates W accommodated in the processing container 10. In the present embodiment, the heater 50 includes a cylindrical heat insulator and a heat generating element that is spirally provided on the inner peripheral surface of the heat insulator.

Figure 3A:
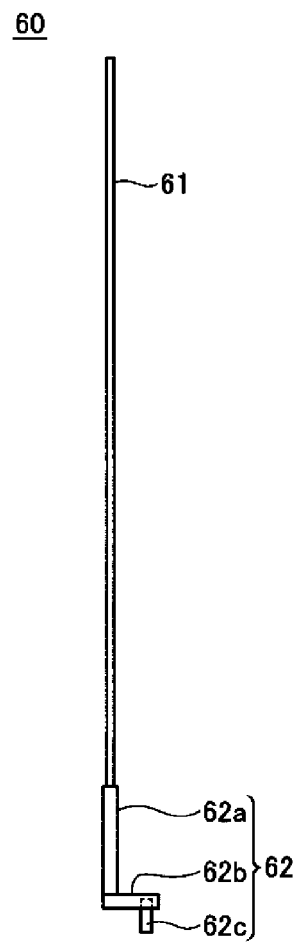
FIGS. 3A to 3C are views illustrating an example of an opening/closing unit that opens/closes an opening of a plasma partition wall.
Figure 3B:
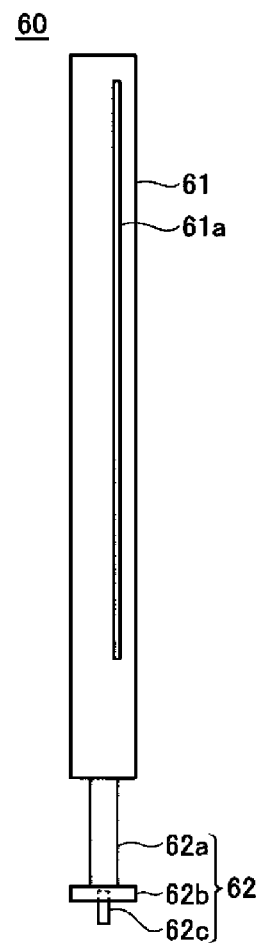
Figure 3C:
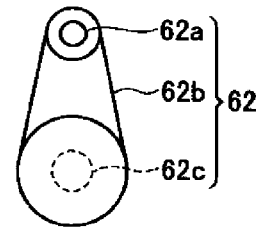
Figure 4:
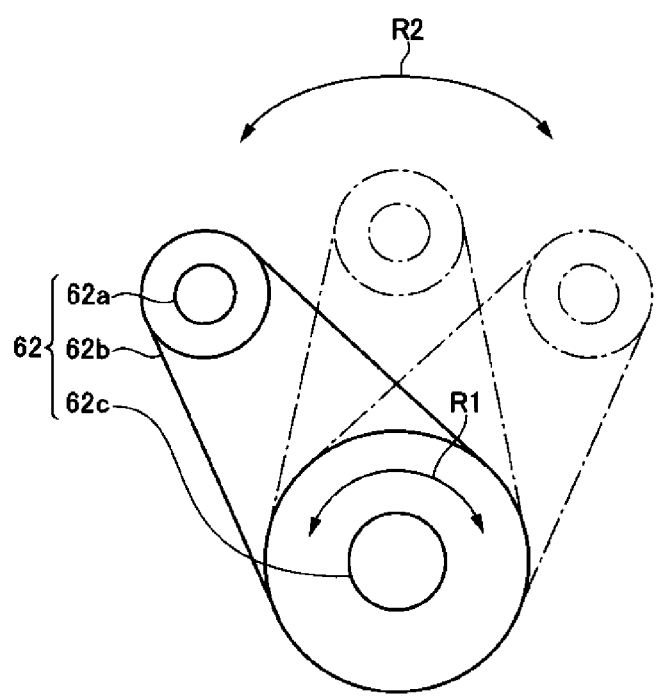
FIG. 4 is a view illustrating an example of an operation of a driving unit of the opening/closing unit.

The opening/closing unit 60 is configured to open/close the opening 37a formed in the plasma partition wall 36a. FIGS. 3A to 3C are views illustrating an example of the opening/closing unit 60 that opens/closes the opening 37a of the plasma partition wall 36a. FIG. 3A is a view of the opening/closing unit 60 when viewed from the circumferential direction of the processing container 10, FIG. 3B is a view of the opening/closing unit 60 when viewed from the center O of the processing container 10, and FIG. 3C is a view of the opening/closing unit 60 when viewed from above. FIG. 3C omits the illustration of an opening/closing plate 61. FIG. 4 is a view illustrating an example of an operation of a driving unit 62 of the opening/closing unit 60. In the present embodiment, the opening/closing unit 60 includes the opening/closing plate 61, the driving unit 62, and an inclination suppressing member 63.

The opening/closing plate 61 is provided longitudinally in the processing container 10, and configured to open/close the opening 37a of the plasma partition wall 36a. The opening/closing plate 61 has a long slender rectangular shape of which longitudinal direction is the vertical direction and transverse direction is the horizontal direction, so as to cover the entire opening 37a. The opening/closing plate 61 may be formed of a quartz glass plate having a plate thickness of 2 mm to 3 mm. As a result, when the opening/closing plate 61 closes the opening 37a, the opening/closing plate 61 may be pressed against the plasma partition wall 36a by utilizing the elasticity of the quartz glass plate, so that the adhesion and the airtightness between the opening/closing plate 61 and the outer wall surface of the plasma partition wall 36a are improved. The opening/closing plate 61 has a passage window 61a that passes the reaction gas from the plasma generation space Pa into the processing container 10. The passage window 61a has, for example, a slit shape that has the same size as or substantially the same size as that of the opening 37a.

The driving unit 62 is configured to drive the opening/closing plate 61 between a position for opening the opening 37a and a position for closing the opening 37a. The position for opening the opening 37a is the position where the passage window 61a and the opening 37a overlap with each other, and the position for closing the opening 37a is the position where the passage window 61a and the opening 37a do not overlap with each other. FIG. 2 illustrates an example of a case where the opening/closing plate 61 is placed in the position for closing the opening 37a. In the present embodiment, the driving unit 62 includes a connector 62a, a horizontal driving plate 62b, a rotary shaft 62c, a transfer unit 62d, and a driving source 62e.

The connector 62a is provided in the processing container 10, and connects the lower end of the opening/closing plate 61 and the horizontal driving plate 62b to each other.

The horizontal driving plate 62b is provided in the processing container 10, and transfers the rotation of the rotary shaft 62c to the opening/closing plate 61 via the connector 62a.

The rotary shaft 62c is configured to rotationally drive the horizontal driving plate 62b. For example, as illustrated in FIG. 4, when the rotary shaft 62c rotates as indicated by the arrow R1, the horizontal driving plate 62b is rotationally driven as indicated by the arrow R2. In the present embodiment, the rotary shaft 62c is disposed on the outer peripheral side of the processing container 10 relative to the opening/closing plate 61. As a result, the opening/closing plate 61 is rotationally driven around the outer peripheral side of the processing container 10 relative to the opening/closing plate 61.

The transfer unit 62d penetrates the side wall of the manifold 11 from inside to outside, and transfers the power of the driving source 62e to the rotary shaft 62c. A magnetic fluid seal (not illustrated) is provided at the portion of the manifold 11 that the transfer unit 62d penetrates. The magnetic fluid seal airtightly seals and rotatably supports the transfer unit 62d.

The driving source 62e is provided outside the processing container 10, and rotates the rotary shaft 62c via the transfer unit 62d. The driving source 62e may be, for example, a motor.

FIG. 5 is a view illustrating the operation of the opening/closing unit 60. As illustrated in the left figure of FIG. 5, when the rotating shaft 62c is rotated counterclockwise, the rotational driving of the rotary shaft 62c is transferred to the opening/closing plate 61 via the horizontal driving plate 62b and the connector 62a, and the opening/closing plate 61 moves to the closing position where the passage window 61a and the opening 37a do not overlap with each other. As a result, the communication state between the inside of the processing container 10 and the plasma generation space Pa is shut off. The case where the "communication state is shut off" includes not only a case where the communication state is completely shut off but also a case where a slight leakage exists. In this state, when the raw material gas is supplied from the gas supply pipe 21 into the processing container 10, the raw material gas may be suppressed from flowing into the plasma generation space Pa from the inside of the processing container 10. Thus, the raw material gas may be suppressed from adhering to the inner wall of the plasma partition wall 36a. As a result, it is possible to suppress a film from being deposited on the inner wall of the plasma partition wall 36a.

As illustrated in the right figure of FIG. 5, when the rotary shaft 62c is rotated clockwise, the rotational driving of the rotary shaft 62c is transferred to the opening/closing plate 61 via the horizontal driving plate 62b and the connector 62a, and the opening/closing plate 61 moves to the opening position where the passage window 61a and the opening 37a overlap with each other. As a result, the inside of the processing container 10 and the plasma generation space Pa communicate with each other. In this state, when the reaction gas is supplied from the gas supply pipe 22 into the plasma generation space Pa, and the radio-frequency power is supplied to the plasma electrode 35a, the reaction gas is activated by plasma in the plasma generation space Pa, and the activated reaction gas is supplied into the processing container 10.

The inclination suppressing member 63 is configured to prevent the opening/closing plate 61 from falling toward the center of the processing container 10 and coming into contact with the substrates W. In the present embodiment, the inclination suppressing member 63 is welded to the top of the plasma partition wall 36a. The inclination suppressing member 63 extends upward from the top of the plasma partition wall 36a, and is bent downward in a substantially U shape. The downwardly bent portion of the inclination suppressing member 63 is disposed closer to the center of the processing container 10 than the opening/closing plate 61, and prevents the falling of the opening/closing plate 61 by coming into contact with the opening/closing plate 61 when the opening/closing plate 61 is inclined toward the center of the processing container 10. The inclination suppressing member 63 is formed of, for example, quartz.

The controller 90 controls each unit of the plasma processing apparatus 1 to perform a plasma processing method (to be described later). The controller 90 may be, for example, a computer. A storage medium stores a computer program for performing the operation of each unit of the processing apparatus 1. The storage medium may be, for example, a flexible disk, a compact disk, a hard disk, a flash memory, or a DVD.

Figure 6:
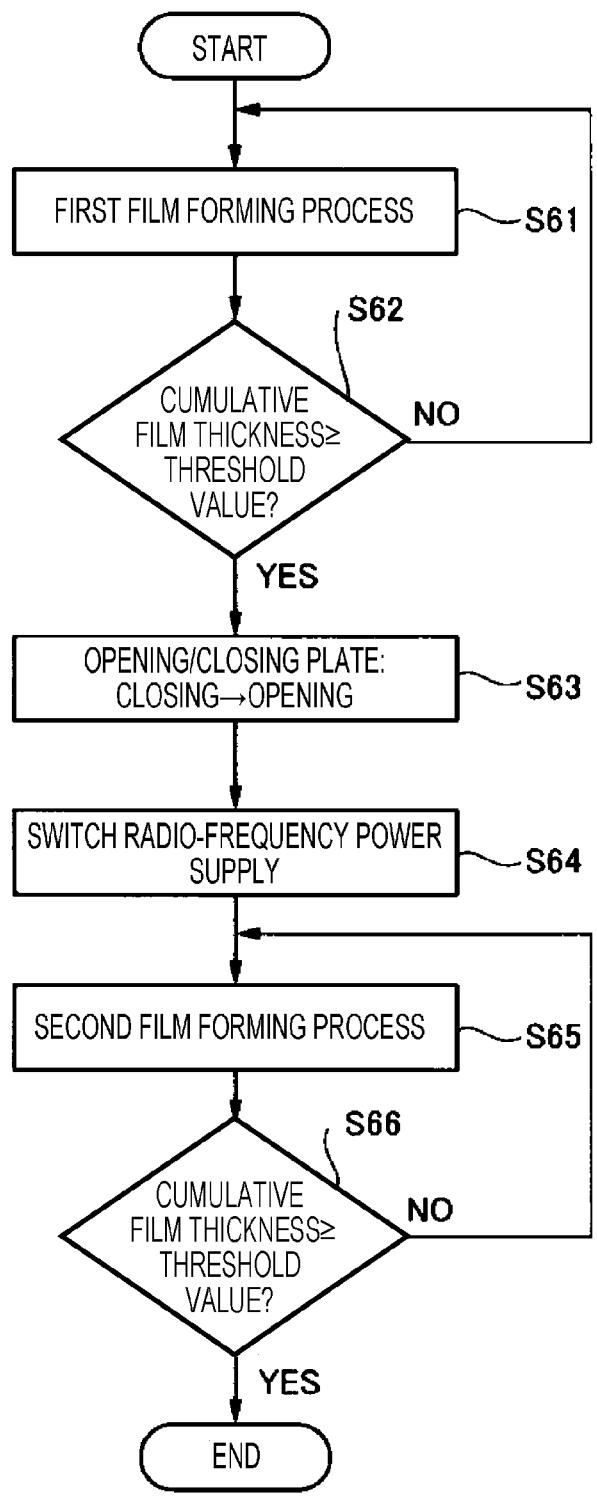
FIG. 6 is a flowchart illustrating an example of a plasma processing method according to the first embodiment.

Next, an example of the plasma processing method performed in the plasma processing apparatus 1 will be described. FIG. 6 is a flowchart illustrating an example of the plasma processing method according to the first embodiment. The plasma processing method of the first embodiment includes steps S61 to S66. Hereinafter, descriptions will be made assuming that the state of the opening/closing unit 60 before the plasma processing method is performed is the state where the opening/closing plate 61 closes the opening 37a of the plasma partition wall 36a, and the connection destination of the radio-frequency power supply 31 is the plasma electrode 35b.

In step S61, the controller 90 controls each unit of the plasma processing apparatus 1 to perform a first film forming process on the substrates W. The first film forming process may be, for example, an ALD process of forming a silicon nitride film on the substrates W by the ALD. In the ALD process, the silicon nitride film is formed on the substrates W by performing a cycle, a plurality of times, which includes a step of supplying the raw material gas from the gas supply pipe 21 into the processing container 10 and a step of supplying the reaction gas from the gas supply pipe 23 into the processing container 10. Since the opening/closing plate 61 closes the opening 37a of the plasma partition wall 36a during the ALD process, the raw material gas and the reaction gas are suppressed from adhering to the inner wall of the plasma partition wall 36a. In the first film forming process, a purge gas may be supplied from the gas supply pipe 22 into the plasma generation space Pa. As a result, the raw material gas supplied from the gas supply pipe 21 into the processing container 10 may be particularly suppressed from flowing into the plasma generation space Pa. The flow rate of the purge gas supplied from the gas supply pipe 22 may be, for example, 300 sccm to 700 sccm. The first film forming process that is repeatedly performed may be a process performed by the same recipe, or may include processes performed by different recipes.

In step S62, the controller 90 determines whether the cumulative film thickness is equal to or more than a predetermined threshold value. The cumulative film thickness may be, for example, the thickness of the cumulative film deposited in the processing container 10 as a result of repeatedly performing the first film forming process from the time when the film deposited in the processing container 10 is removed by the dry cleaning. The threshold value is predetermined such that the amount of particles generated on the substrates W does not exceed a controlled value. For example, when the first film forming process is an ALD process of forming a silicon nitride film using plasma at 500° C. to 600° C., the threshold value may be around 1 μm. When it is determined in step S62 that the cumulative film thickness is equal to or more than the threshold value, the process proceeds to step S63. Meanwhile, when it is determined in step S62 that the cumulative film thickness is not equal to or more than the threshold value, the process returns to step S61. In this way, in the plasma processing apparatus 1, the first film forming process is repeatedly performed until the cumulative film thickness becomes equal to or more than the threshold value.

In step S63, the controller 90 controls the opening/closing unit 60 to rotationally drive the opening/closing plate 61 from the position for closing the opening 37a of the plasma partition wall 36a to the position for opening the opening 37a of the plasma partition wall 36a. As a result, the inside of the processing container 10 and the plasma generation space Pa communicate with each other.

In step S64, the controller 90 controls the switching unit 33 to switch the connection destination of the radio-frequency power supply 31 from the plasma electrode 35b to the plasma electrode 35a. As a result, the reaction gas supplied into the plasma generation space Pa may be activated by plasma. Step S64 may be performed simultaneously with step S63, or may be performed before step S63.

In step S65, the controller 90 controls each unit of the plasma processing apparatus 1 to perform a second film forming process on the substrates W. The second film forming process may be, for example, an ALD process of forming a silicon nitride film on the substrates W by the ALD, similarly to the first film forming process. For example, the ALD process may be the same as the ALD process in the first film forming process.

In step S66, the controller 90 determines whether the cumulative film thickness is equal to or more than a predetermined threshold value. The cumulative film thickness may be, for example, the thickness of the cumulative film deposited in the processing container 10 as a result of repeatedly performing the second film forming process from the time when the film deposited in the processing container 10 is removed by the dry cleaning. For example, the threshold value is predetermined such that the amount of particles generated on the substrates W does not exceed a controlled value. For example, when the second film forming process is an ALD process of forming a silicon nitride film using plasma at 500° C. to 600° C., the threshold value may be around 1 μm. When it is determined in step S66 that the cumulative film thickness is equal to or more than the threshold value, the process ends. Meanwhile, when it is determined in step S66 that the cumulative film thickness is not equal to or more than the threshold value, the process returns to step S65. In this way, in the plasma processing apparatus 1, the second film forming process is repeatedly performed until the cumulative film thickness becomes equal to or more than the threshold value.

As described above, according to the plasma processing method of the first embodiment, the first film forming process is repeatedly performed using the reaction gas activated by plasma in the plasma generation space Pb until the cumulative film thickness becomes equal to or more than the threshold value. Subsequently, without performing the dry cleaning, the opening/closing plate 61 is moved from the closing position to the opening position, and the connection destination of the radio-frequency power supply 31 is switched from the plasma electrode 35b to the plasma electrode 35a by the switching unit 33. Subsequently, the second film forming process is repeatedly performed using the reaction gas activated by plasma in the plasma generation space Pa until the cumulative film thickness becomes equal to or more than the threshold value. As a result, the dry cleaning cycle may be extended to be about twice that in a case where the opening/closing plate 61 is not used. As a result, the operation rate of the plasma processing apparatus 1 increases. Further, the number of processes for controlling the quality may be reduced, and material costs may be reduced.

Second Embodiment

Figure 7:
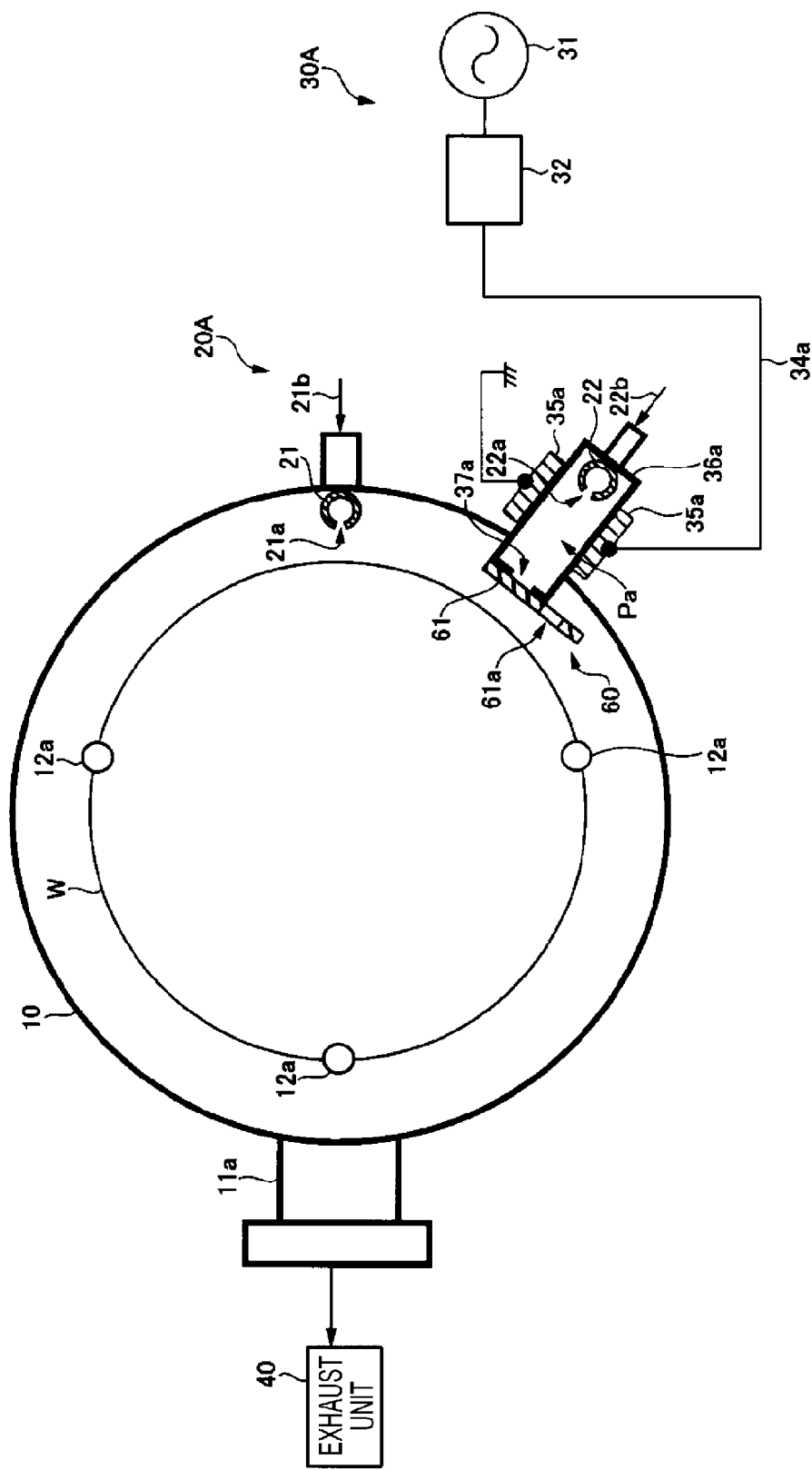
FIG. 7 is a schematic view illustrating an example of a plasma processing apparatus according to a second embodiment.

A plasma processing apparatus according to a second embodiment will be described. FIG. 7 is a schematic view illustrating an example of the plasma processing apparatus of the second embodiment. A plasma processing apparatus 1A of the second embodiment is different from the plasma processing apparatus 1 of the first embodiment in that the plasma processing apparatus 1A includes one plasma generation space. Hereinafter, descriptions will be made focusing on the differences from the plasma processing apparatus 1 of the first embodiment.

The plasma processing apparatus 1A includes a processing container 10, a gas supply 20A, a plasma generator 30A, an exhaust unit 40, a heater 50, an opening/closing unit 60, and a controller 90.

The gas supply 20A is configured to supply a gas into the processing container 10. In the present embodiment, the gas supply 20A includes gas supply pipes 21 and 22. The gas supply pipes 21 and 22 are formed of, for example, quartz. The gas supply pipes 21 and 22 may be similar in configuration to the gas supply pipes 21 and 22 of the first embodiment.

The plasma generator 30A activates the reaction gas by plasma. In the present embodiment, the plasma generator 30A includes a radio-frequency power supply 31, a matching circuit 32, a power feeding line 34a, a plasma electrode 35a, and a plasma partition wall 36a. The radio-frequency power supply 31, the matching circuit 32, the power feeding line 34a, the plasma electrode 35a, and the plasma partition wall 36a may be similar in configuration to the radio-frequency power supply 31, the matching circuit 32, the power feeding line 34a, the plasma electrode 35a, and the plasma partition wall 36a of the first embodiment.

Figure 8:
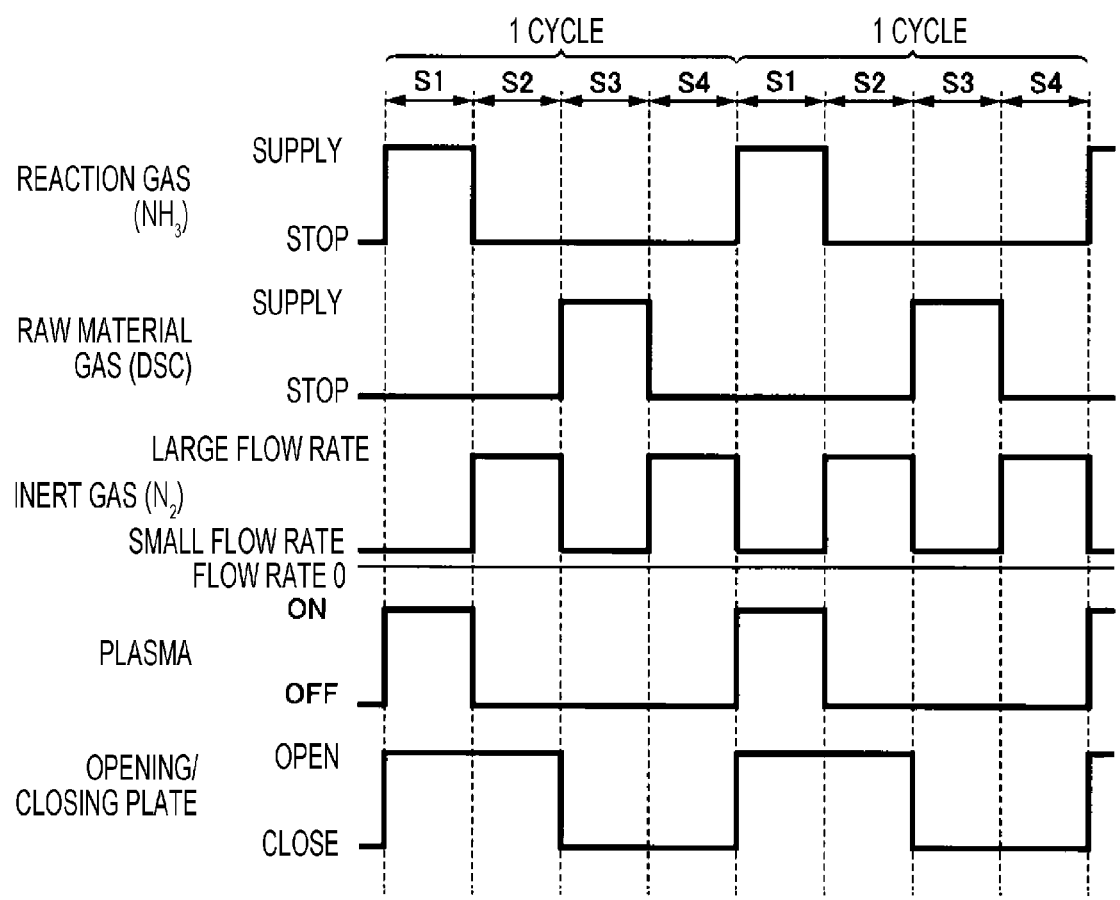
FIG. 8 is a view illustrating an example of a plasma processing method according to the second embodiment.

Next, an example of a plasma processing method performed in the plasma processing apparatus 1A will be described. FIG. 8 is a view illustrating an example of the plasma processing method of the second embodiment. As illustrated in FIG. 8, the plasma processing method of the second embodiment includes an ALD process of forming a silicon nitride film on the substrates W by performing a cycle including steps S1 to S4 a plurality of times.

In step S1, the controller 90 controls the opening/closing unit 60 to move the opening/closing plate 61 to the opening positon. In this state, the controller 90 supplies the reaction gas (e.g., $NH_3$ gas) from the gas supply pipe 22 into the plasma generation space Pa, and supplies the radio-frequency power from the radio-frequency power supply 31 to the plasma electrode 35a. As a result, the reaction gas is activated by plasma in the plasma generation space Pa, and supplied into the processing container 10. The reaction gas supplied into the processing container 10 reacts with the raw material gas (e.g., DCS gas) adsorbed on the substrates W to generate a reaction product (e.g., silicon nitride). Further, in step S1, inert gas (e.g., $N_2$ gas) is supplied from a gas supply pipe (not illustrated) into the processing container 10 at a small flow rate.

In step S2, the controller 90 stops the supply of the reaction gas from the gas supply pipe 22 into the plasma generation space Pa and the supply of the radio-frequency power from the radio-frequency power supply 31 to the plasma electrode 35a, and further, increases the flow rate of inert gas supplied from the gas supply pipe (not illustrated) into the processing container 10. As a result, the reaction gas remaining in the processing container 10 is removed from the inside of the processing container 10.

In step S3, the controller 90 reduces the flow rate of inert gas supplied from the gas supply pipe (not illustrated) into the processing container 10. Further, the controller 90 controls the opening/closing unit 60 to move the opening/closing plate 61 to the closing position, and in this state, supplies the raw material gas (e.g., DCS gas) from the gas supply pipe 21 into the processing container 10. As a result, the raw material gas is adsorbed onto the substrates W. At this time, since the opening/closing plate 61 is placed in the closing position, that is, the opening/closing plate 61 closes the opening 37a of the plasma partition wall 36a, the raw material gas may be suppressed from flowing into the plasma generation space Pa from the processing container 10. Thus, the raw material gas may be suppressed from adhering to the inner wall of the plasma partition wall 36a. As a result, it is possible to suppress the film from being deposited on the inner wall of the plasma partition wall 36a. Further, in step S3, a purge gas may be supplied from the gas supply pipe 22 into the plasma generation space Pa. As a result, the raw material gas supplied from the gas supply pipe 21 into the processing container 10 may be particularly suppressed from flowing into the plasma generation space Pa.

In step S4, the controller 90 stops the supply of the raw material gas from the gas supply pipe 21 into the plasma generation space Pa, and further, increases the flow rate of inert gas supplied from the gas supply pipe (not illustrated) into the processing container 10. As a result, the reaction gas remaining in the processing container 10 is removed from the inside of the processing container 10. Further, in step S4, the controller 90 may control the opening/closing unit 60 to move the opening/closing plate 61 to the opening position. However, from the viewpoint of suppressing the raw material gas remaining in the processing container 10 from flowing into the plasma generation space Pa, the opening/closing plate 61 may be maintained in the closing position in step S4.

Figure 9:
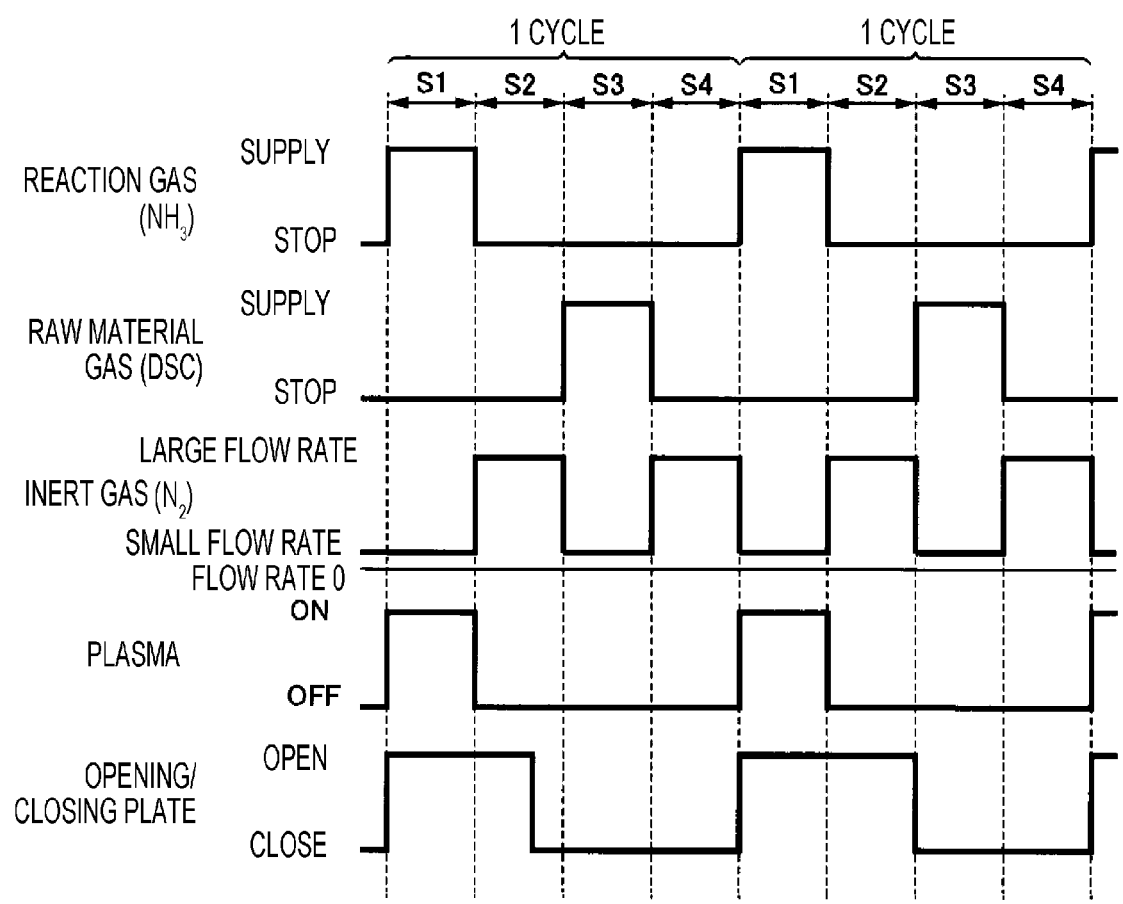
FIG. 9 is a view illustrating another example of the plasma processing method according to the second embodiment.

Next, another example of the plasma processing method performed in the plasma processing apparatus 1A will be described. FIG. 9 is a view illustrating another example of the plasma processing method of the second embodiment. The plasma processing method illustrated in FIG. 9 is different from the plasma processing method illustrated in FIG. 8 in that the opening/closing plate 61 is moved from the opening position to the closing position in the middle of step S2. The other processes are similar to those of the plasma processing method illustrated in FIG. 8.

In the plasma processing method illustrated in FIG. 9, the opening/closing plate 61 closes the opening 37a of the plasma partition wall 36a before the supply of the raw material gas into the processing container 10 is started. Accordingly, the raw material gas supplied from the gas supply pipe 21 into the processing container 10 immediately after step S3 is started may be suppressed from flowing into the plasma generation space Pa. As a result, the raw material gas supplied from the gas supply pipe 21 into the processing container 10 may be particularly suppressed from flowing into the plasma generation space Pa.

As described above, according to the plasma processing method of the second embodiment, at least when the raw material gas is supplied into the processing container 10, the opening/closing plate 61 is moved to the closing position to close the opening 37a of the plasma partition wall 36a. Accordingly, the raw material gas is suppressed from flowing into the plasma generation space Pa, so that the dry cleaning cycle may be extended to be 1.5 times or more that in a case where the opening/closing plate 61 is not used. As a result, the operation rate of the plasma processing apparatus 1 increases. Further, the number of processes for controlling the quality may be reduced, and material costs may be reduced.

The plasma processing method of the second embodiment is also applicable to the second film forming process in the plasma processing method of the first embodiment. That is, in the second film forming process, at least when the raw material gas is supplied into the processing container 10, the opening/closing plate 61 may be moved to the closing position to close the opening 37a of the plasma partition wall 36a.

In the embodiments described above, the gas supply pipe 21 is an example of a raw material gas supply, the gas supply pipe 22 is an example of a reaction gas supply, and the gas supply pipe 23 is an example of a second reaction gas supply. The plasma partition wall 36b is an example of a second plasma partition wall, the opening 37b is an example of a second opening, and the plasma generation space Pb is an example of a second plasma generation space.

In the embodiments described above, the processing container has a single-tube structure. However, the present disclosure is not limited thereto. For example, the processing container may have a double-tube structure.

In the embodiments described above, the substrate is a semiconductor wafer. However, the present disclosure is not limited thereto. For example, the substrate may be a large substrate for a flat panel display (FPD), a substrate for an organic EL panel or a substrate for a solar cell.

According to the present disclosure, it is possible to suppress a film from being deposited in a plasma generator.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. A plasma processing apparatus comprising:
a processing container extended in a longitudinal direction;
a raw material gas supply configured to supply a raw material gas into the processing container;
a plasma partition wall provided along the longitudinal direction of the processing container, defining a plasma generation space therein, and having an opening through which the plasma generation space and an inside of the processing container communicate with each other;
a reaction gas supply configured to supply a reaction gas that reacts with the raw material gas, into the plasma generation space;
an opening/closing plate provided between the plasma generation space and the inside of the processing container along the longitudinal direction of the processing container and configured to open/close the opening; and
an inclination suppressing plate that suppresses the opening/closing plate from inclining toward a center of the processing container.

2. The plasma processing apparatus according to claim 1, further comprising:
a driver including a motor configured to drive the opening/closing plate between a position for opening the opening and a position for closing the opening.

3. The plasma processing apparatus according to claim 1, wherein the opening/closing plate includes a passage window through which the reaction gas passes, and
an opening position of the opening is a position where the passage window and the opening overlap with each other, and a closing position of the opening is a position where the passage window and the opening do not overlap with each other.

4. The plasma processing apparatus according to claim 1, wherein the opening/closing plate is a quartz glass plate.

5. The plasma processing apparatus according to claim 4, wherein the quartz glass plate has a plate thickness of 2 mm to 3 mm.

6. The plasma processing apparatus according to claim 2, wherein the driver rotationally drives the opening/closing plate.

7. The plasma processing apparatus according to claim 6, wherein the opening/closing plate is rotationally driven around an outer peripheral side of the processing container relative to the opening/closing plate.

8. The plasma processing apparatus according to claim 1, wherein the inclination suppressing plate extends upward from a top of the plasma partition wall, and is bent downward in a substantially U shape.

9. The plasma processing apparatus according to claim 8, wherein the inclination suppressing plate suppresses an inclination of the opening/closing plate by coming into contact with a surface of the opening/closing plate that faces the inside of the processing container.

10. The plasma processing apparatus according to claim 9, wherein the raw material gas is silicon raw material gas, and the reaction gas is nitride gas.

11. The plasma processing apparatus according to claim 10, further comprising:
a controller configured to:
supply the reaction gas from the reaction gas supply into the plasma generation space in a state where the opening is opened by the opening/closing plate, and
supply the raw material gas from the raw material gas supply into the processing container in a state where the opening is closed by the opening/closing plate.

12. The plasma processing apparatus according to claim 11, wherein the controller is configured to activate the reaction gas by plasma in the supplying the reaction gas.

13. The plasma processing apparatus according to claim 12, wherein the controller is configured to supply a purge gas into the plasma generation space in the supplying the raw material gas.

14. The plasma processing apparatus according to claim 13, wherein the purge gas is supplied from the reaction gas supply into the plasma generation space.

15. The plasma processing apparatus according to claim 10, further comprising:
a second plasma partition wall provided along the longitudinal direction of the processing container to be separate from the plasma partition wall, defining a second plasma generation space therein, and having a second opening through which the second plasma generation space and the inside of the processing container communicate with each other;
a second reaction gas supply configured to supply the reaction gas into the second plasma generation space; and
a controller configured to:
perform a first film forming process that includes supplying the raw material gas from the raw material gas supply into the processing container and supplying the reaction gas from the second reaction gas supply into the second plasma generation space, in a state where the opening is closed by the opening/closing plate, and
perform a second film forming process that includes supplying the reaction gas from the reaction gas supply into the plasma generation space in a state where the opening is opened by the opening/closing plate.

16. The plasma processing apparatus according to claim 15, wherein the second film forming process includes supplying the raw material gas from the raw material gas supply into the processing container in a state where the opening is closed by the opening/closing plate.

17. The plasma processing apparatus according to claim 16, wherein the controller performs the second film forming process when a cumulative film thickness of a film deposited in the processing container as a result of repeating the performing the first film forming process becomes equal to or more than a threshold value.

18. A plasma processing method, using a plasma processing apparatus including:
a processing container extended in a longitudinal direction,
a raw material gas supply configured to supply a raw material gas into the processing container,
a plasma partition wall provided along the longitudinal direction of the processing container, defining a plasma generation space therein, and having an opening through which the plasma generation space and an inside of the processing container communicate with each other,
a reaction gas supply configured to supply a reaction gas that reacts with the raw material gas, into the plasma generation space,
an opening/closing plate provided between the plasma generation space and the inside of the processing container along the longitudinal direction of the processing container and configured to open/close the opening, and
an inclination suppressing plate that suppresses the opening/closing plate from inclining toward a center of the processing container,
the method comprising:
supplying the reaction gas from the reaction gas supply into the plasma generation space in a state where the opening is opened by the opening/closing plate; and
supplying the raw material gas from the raw material gas supply into the processing container in a state where the opening is closed by the opening/closing plate.

19. A plasma processing method, using a plasma processing apparatus including:
a processing container extended in a longitudinal direction,
a raw material gas supply configured to supply a raw material gas into the processing container,
a plasma partition wall provided along the longitudinal direction of the processing container, defining a plasma generation space therein, and having an opening through which the plasma generation space and an inside of the processing container communicate with each other,
a reaction gas supply configured to supply a reaction gas that reacts with the raw material gas, into the plasma generation space,
an opening/closing plate provided between the plasma generation space and the inside of the processing container along the longitudinal direction of the processing container and configured to open/close the opening,
an inclination suppressing plate that suppresses the opening/closing plate from inclining toward a center of the processing container, a second plasma partition wall provided along the longitudinal direction of the processing container to be separate from the plasma partition wall, defining a second plasma generation space therein, and having a second opening through which the second plasma generation space and the inside of the processing container communicate with each other, and a second reaction gas supply configured to supply the reaction gas into the second plasma generation space, the method comprising:

performing a first film forming process that includes supplying the raw material gas from the raw material gas supply into the processing container and supplying the reaction gas from the second reaction gas supply into the second plasma generation space, in a state where the opening is closed by the opening/closing plate; and performing a second film forming process that includes supplying the reaction gas from the reaction gas supply into the plasma generation space in a state where the opening is opened by the opening/closing plate.

* * * * *